(12) United States Patent
Patterson

(10) Patent No.: US 8,018,739 B2
(45) Date of Patent: Sep. 13, 2011

(54) APPARATUS FOR SHIELDING INTEGRATED CIRCUIT DEVICES

(75) Inventor: Janet Patterson, San Diego, CA (US)

(73) Assignee: Maxwell Technologies, LLC, San Diego, CA (US)

( * ) Notice: Subject to any disclaimer, the term of this patent is extended or adjusted under 35 U.S.C. 154(b) by 0 days.

(21) Appl. No.: 12/719,123

(22) Filed: Mar. 8, 2010

(65) Prior Publication Data

US 2010/0155912 A1      Jun. 24, 2010

Related U.S. Application Data

(62) Division of application No. 11/559,140, filed on Nov. 13, 2006, now Pat. No. 7,696,610, and a division of application No. 10/621,844, filed on Jul. 16, 2003, now Pat. No. 7,191,516.

(51) Int. Cl.
*H05K 9/00* (2006.01)

(52) U.S. Cl. ........ 361/816; 361/735; 361/818; 361/800; 174/350; 257/659; 257/660; 257/686

(58) Field of Classification Search .................. 257/659, 257/660, 685, 686; 361/735, 800, 816, 818; 174/350
See application file for complete search history.

(56) References Cited

U.S. PATENT DOCUMENTS

| | | | |
|---|---|---|---|
| 3,646,409 A | 2/1972 | van de Water et al. |
| 3,706,840 A | 12/1972 | Moyle et al. |
| 3,771,025 A | 11/1973 | Berner |
| 3,828,425 A | 8/1974 | Manus |
| 3,895,143 A | 7/1975 | Tarlow |
| 3,914,858 A | 10/1975 | Sonoda et al. |
| 3,933,530 A | 1/1976 | Mueller et al. |
| 4,014,772 A | 3/1977 | Woods et al. |
| 4,089,575 A | 5/1978 | Grabbe |
| 4,091,407 A | 5/1978 | Williams et al. |
| 4,100,675 A | 7/1978 | Landsittel |
| 4,148,049 A | 4/1979 | Cricchi et al. |
| 4,167,647 A | 9/1979 | Salera |
| 4,173,683 A | 11/1979 | Comizzoli |
| 4,250,347 A | 2/1981 | Fierkens |
| 4,266,239 A | 5/1981 | Miyagaki et al. |

(Continued)

FOREIGN PATENT DOCUMENTS

CN    1094833    11/1994

(Continued)

OTHER PUBLICATIONS

International Search Report for international application No. PCT/US04/22344 mailed Mar. 15, 2005, Jun. 8, 2011.

(Continued)

*Primary Examiner* — Dameon Levi
(74) *Attorney, Agent, or Firm* — Oppedahl Patent Law Firm LLC

(57) ABSTRACT

A high reliability radiation shielding integrated circuit apparatus comprising a plurality of package layers; a radiation shielding lid or base coupled to the plurality of package layers; wherein the circuit die are shielded from receiving an amount of radiation greater than the total dose of tolerance of the circuit die. In one embodiment, an integrated circuit apparatus for use in high reliability applications is disclosed. The integrated circuit apparatus is designed to be highly reliable and protect integrated circuit die from failing or becoming unreliable due to radiation, mechanical forces, thermal exposure, or chemical contaminates.

45 Claims, 10 Drawing Sheets

U.S. PATENT DOCUMENTS

| | | | |
|---|---|---|---|
| 4,313,768 A | 2/1982 | Sanders et al. | |
| 4,323,405 A | 4/1982 | Uno et al. | |
| 4,402,002 A | 8/1983 | Sanders et al. | |
| 4,468,411 A | 8/1984 | Sloan et al. | |
| 4,494,217 A | 1/1985 | Suzuki et al. | |
| 4,506,108 A | 3/1985 | Kersch et al. | |
| 4,614,836 A | 9/1986 | Carpenter | |
| 4,633,573 A | 1/1987 | Scherer | |
| 4,639,826 A | 1/1987 | Val et al. | |
| 4,652,465 A | 3/1987 | Koto et al. | |
| 4,661,837 A | 4/1987 | Sono | |
| 4,663,240 A | 5/1987 | Hajdu et al. | |
| 4,675,978 A | 6/1987 | Swartz | |
| 4,687,622 A | 8/1987 | Longden | |
| 4,769,344 A | 9/1988 | Sakai et al. | |
| 4,823,523 A | 4/1989 | Coupard et al. | |
| 4,825,278 A | 4/1989 | Hillenius et al. | |
| 4,833,334 A | 5/1989 | Valy et al. | |
| 4,835,120 A | 5/1989 | Mallik et al. | |
| 4,837,448 A | 6/1989 | Sainte Luce Banchelin et al. | |
| 4,839,716 A | 6/1989 | Butt | |
| 4,868,716 A | 9/1989 | Taylor et al. | |
| 4,888,449 A | 12/1989 | Crane et al. | |
| 4,891,687 A | 1/1990 | Mallik et al. | |
| 4,903,108 A | 2/1990 | Young et al. | |
| 4,922,754 A | 5/1990 | Horne et al. | |
| 4,935,174 A | 6/1990 | Suzuki | |
| 4,953,002 A | 8/1990 | Nelson et al. | |
| 4,967,315 A | 10/1990 | Schelhorn | |
| 4,975,762 A | 12/1990 | Stradley et al. | |
| 4,979,019 A | 12/1990 | Paquette et al. | |
| 5,001,528 A | 3/1991 | Baharaman | |
| 5,006,479 A | 4/1991 | Brandewie | |
| 5,024,965 A | 6/1991 | Chang et al. | |
| 5,047,260 A | 9/1991 | Durand | |
| 5,086,443 A | 2/1992 | Bloch et al. | |
| 5,096,851 A | 3/1992 | Yamazaki et al. | |
| 5,138,430 A | 8/1992 | Gow, 3rd et al. | |
| 5,139,969 A | 8/1992 | Mori | |
| 5,140,390 A | 8/1992 | Li et al. | |
| 5,149,662 A | 9/1992 | Eichelberger | |
| 5,151,770 A | 9/1992 | Inoue | |
| 5,160,374 A | 11/1992 | Frederickson | |
| 5,166,772 A | 11/1992 | Soldner et al. | |
| 5,180,513 A | 1/1993 | Durand | |
| 5,202,536 A | 4/1993 | Buonanno | |
| 5,206,794 A | 4/1993 | Long | |
| 5,220,192 A | 6/1993 | Owens et al. | |
| 5,239,126 A | 8/1993 | Oshiba | |
| 5,250,845 A | 10/1993 | Runyan | |
| 5,268,331 A | 12/1993 | Abbott | |
| 5,294,826 A | 3/1994 | Marcantonio et al. | |
| 5,304,750 A | 4/1994 | Schubert et al. | |
| 5,317,107 A | 5/1994 | Osorio | |
| 5,324,952 A | 6/1994 | Cummings | |
| 5,384,477 A | 1/1995 | Bulucea et al. | |
| 5,406,117 A | 4/1995 | Dlugokecki et al. | |
| 5,422,435 A | 6/1995 | Takiar et al. | |
| 5,424,251 A | 6/1995 | Sono et al. | |
| 5,426,566 A | 6/1995 | Beilstein, Jr. et al. | |
| 5,436,411 A | 7/1995 | Pasch | |
| 5,441,900 A | 8/1995 | Bulucea et al. | |
| 5,495,394 A | 2/1996 | Kornfeld et al. | |
| 5,495,398 A | 2/1996 | Takiar et al. | |
| 5,498,900 A | 3/1996 | Dunaway et al. | |
| 5,502,289 A | 3/1996 | Takiar et al. | |
| 5,527,742 A | 6/1996 | Weiler et al. | |
| 5,552,338 A | 9/1996 | Kang | |
| 5,552,633 A | 9/1996 | Sharma | |
| 5,561,265 A | 10/1996 | Livshits et al. | |
| 5,577,319 A | 11/1996 | Knecht | |
| 5,578,526 A | 11/1996 | Akram et al. | |
| 5,589,129 A | 12/1996 | Kato et al. | |
| 5,600,541 A | 2/1997 | Bone | |
| 5,610,443 A | 3/1997 | Inagaki et al. | |
| 5,635,754 A | 6/1997 | Strobel et al. | |
| 5,672,918 A | 9/1997 | Kimbrough et al. | |
| 5,694,300 A * | 12/1997 | Mattei et al. | 361/818 |
| 5,706,840 A | 1/1998 | Schneider et al. | |
| 5,714,102 A | 2/1998 | Highum et al. | |
| 5,763,939 A | 6/1998 | Yamashita | |
| 5,770,304 A | 6/1998 | Nakamura et al. | |
| 5,780,163 A | 7/1998 | Camilletti et al. | |
| 5,824,568 A | 10/1998 | Zechman | |
| 5,825,042 A | 10/1998 | Strobel et al. | |
| 5,828,425 A | 10/1998 | Kim | |
| 5,851,852 A | 12/1998 | Ostop et al. | |
| 5,864,088 A | 1/1999 | Sato et al. | |
| 5,880,403 A * | 3/1999 | Czajkowski et al. | 174/387 |
| 5,888,850 A | 3/1999 | Havens et al. | |
| 5,889,316 A | 3/1999 | Strobel et al. | |
| 5,935,177 A | 8/1999 | Cox | |
| 5,939,722 A | 8/1999 | Werner et al. | |
| 5,992,237 A | 11/1999 | McCarty et al. | |
| 5,998,867 A | 12/1999 | Jensen et al. | |
| 6,064,555 A | 5/2000 | Czajkowski et al. | |
| 6,097,080 A | 8/2000 | Nakanishi et al. | |
| 6,118,184 A | 9/2000 | Ishio et al. | |
| 6,121,672 A | 9/2000 | Benedetto | |
| 6,261,508 B1 | 7/2001 | Featherby et al. | |
| 6,262,362 B1 * | 7/2001 | Czajkowski et al. | 174/360 |
| 6,303,997 B1 | 10/2001 | Lee | |
| 6,365,960 B1 | 4/2002 | Pollock et al. | |
| 6,368,899 B1 | 4/2002 | Featherby et al. | |
| 6,384,473 B1 | 5/2002 | Peterson et al. | |
| 6,445,591 B1 | 9/2002 | Kwong | |
| 6,455,864 B1 | 9/2002 | Featherby et al. | |
| 6,583,432 B2 | 6/2003 | Featherby | |
| 6,594,156 B1 | 7/2003 | VanAntwerp | |
| 6,613,978 B2 | 9/2003 | Czjakowski | |
| 6,670,702 B2 * | 12/2003 | Corisis et al. | 257/686 |
| 6,720,493 B1 | 4/2004 | Strobel et al. | |
| 6,778,637 B2 | 8/2004 | Luhta | |
| 6,818,974 B2 * | 11/2004 | Yokoyama et al. | 257/676 |
| 6,858,795 B2 | 2/2005 | Czjakowski et al. | |
| 6,880,242 B2 | 4/2005 | VanAntwerp | |
| 6,906,396 B2 | 6/2005 | Tuttle | |
| 7,078,243 B2 * | 7/2006 | Spielberger et al. | 438/3 |
| 7,148,084 B2 | 12/2006 | Strobel | |
| 7,191,516 B2 | 3/2007 | Patterson | |
| 7,272,015 B2 * | 9/2007 | Karrer et al. | 361/790 |
| 7,382,043 B2 | 6/2008 | Longden | |
| 7,514,774 B2 * | 4/2009 | Leung et al. | 257/686 |
| 7,537,962 B2 * | 5/2009 | Jang et al. | 438/109 |
| 7,696,610 B2 | 4/2010 | Patterson | |

FOREIGN PATENT DOCUMENTS

| | | |
|---|---|---|
| EP | 0160327 | 11/1985 |
| FR | 2584863 | 1/1987 |
| JP | 5598846 | 7/1980 |
| JP | 55128851 | 10/1980 |
| JP | 56103452 | 8/1981 |
| JP | 56165341 | 12/1981 |
| JP | 57095650 | 6/1982 |
| JP | 57145345 | 9/1982 |
| JP | 60106150 | 6/1985 |
| JP | 60124834 | 7/1985 |
| JP | 60180150 | 9/1985 |
| JP | 61004249 | 1/1986 |
| JP | 61004250 | 1/1986 |
| JP | 62125651 | 6/1987 |
| JP | 62150776 | 7/1987 |
| JP | 2237053 | 9/1990 |
| JP | 2278740 | 11/1990 |
| JP | 4094560 | 3/1992 |
| JP | 4273200 | 9/1992 |
| JP | 60124834 | 7/1995 |
| JP | 2001189876 | 7/2001 |
| WO | 9622669 | 7/1997 |
| WO | 2004030040 | 4/2004 |
| WO | 2005010937 | 2/2005 |

OTHER PUBLICATIONS

International Preliminary Report on Patentablity for international application No. PCT/US04/22344 completed Jul. 11, 2005, Jun. 8, 2011.

Written Opinion for international application No. PCT/US04/22344 mailed Mar. 15, 2005, Jun. 8, 2011.

Office Action and English Summary of Office Action from related Chinese Application No. 200480020214.X, issued on Apr. 29, 2010, Jun. 8, 2011.

Office Action and English Summary of Office Action from related Chinese Application No. 200480020214.X, issued on Sep. 13, 2010, Jun. 8, 2011.

Office Action and English Summary of Office Action from related Chinese Application No. 200480020214.X, issued on Jan. 19, 2011, Jun. 8, 2011.

Harper, Charles A., ed. Electronic Packaging and Interconnection Handbook. McGraw-Hill, 1991: p. 6.41-6.49, Jun. 8, 2011.

Harper, Charles A., ed. Electronic Packaging and Interconnection Handbook. McGraw-Hill, 1991: p. 6.34, Jun. 8, 2011.

Kovac, Caroline A., "Plastic Package Fabrication." vol. I of Electronic Materials Handbook. Materials Park, OH: ASM International, 1989: p. 470-80, Jun. 8, 2011.

Baze, M.P & A.H. Johnston, "Latchup Paths in Bipolar Integrated Circuits." vol. NS-33, No. 6 of IEEE Transactions on Nuclear Science Dec. 1986: p. 1499-1504, Jun. 8, 2011.

Johnston, A.H. et al., "The Effect of Temperature on Single-Particle Latch-Up." vol. 38, No. 6 of IEEE Transactions on Nuclear Science Dec. 1991: p. 1435-41, Jun. 8, 2011.

Song, Y. et al., "Parametric Investigation of Latch-Up Sensitivity in 1.25 .mu.m CMOS Technology." vol. NS-34, No. 6 of IEEE Transactions on Nuclear Science Dec. 1987: p. 1431-7, Jun. 8, 2011.

Millward, D.G. & D.J. Strobel, "The Effectiveness of Rad-Pak ICs for Space-Radiation Hardening." vol. 2 of 1990 Proceedings 40th Electronic Components and Technology Conference. IEEE, 1990: p. 913-16, Jun. 8, 2011.

International Search Report for international application No. PCT/US03/30245 mailed Apr. 14, 2004, Jun. 8, 2011.

Licari, prior Processes, J., "Non-Hermetic Packaging for Low-Cost, Low-Weight Multichip Modules." Electronic Materials and Processes, Consulting and Short Courses: p. 1-3. Date of publication unavailable, however, the document is admitted prior art, Jun. 8, 2011.

Markstein, Howard, ed. "Overcoating Process Seals Hi-Rel Plastic Packaged Devices." Electronic Packaging and Production Mar. 1995: p. 26-27, Jun. 8, 2011.

* cited by examiner

APPARATUS FOR SHIELDING INTEGRATED CIRCUIT DEVICES

CROSS-REFERENCE TO RELATED APPLICATIONS

This application is a divisional of application Ser. No. 11/559,140, filed Nov. 13, 2006, which is a divisional of application Ser. No. 10/621,844, filed Jul. 16, 2003 each of which applications are incorporated herein by reference for all purposes.

BACKGROUND OF INVENTION

1. Field of the Invention

The present invention relates generally to integrated circuits. More specifically, but without limitation thereto, the present invention relates to packaging of integrated circuits for high-reliability, including, for example, shielding of the integrated circuits from radiation, such as ionizing radiation.

2. Discussion of the Background Art

Various applications in which integrated circuit devices are employed place demands on the integrated circuit devices not typically present in consumer applications. For example, in space satellite applications, ionizing radiation is present in the space environment at levels that often results in an integrated circuit die being exposed to an amount of radiation in excess of the integrated circuit die's total dose tolerance. As a result, the integrated circuit die can become damaged, or perform improperly, such as drifts in parametric performance or loss of functionality. Thus, the integrated circuit device may become unreliable.

Furthermore, excess heat buildup within the integrated circuit device can result in the integrated circuit die operating at a tempers cure in excess of its temperature operating range, in turn potentially resulting in damage to the integrated circuit die, or unreliable performance of the integrated circuit due, such as by the generation of errors At the same time, integrated circuit devices that are sent into space must be robust enough to survive the launch of a spacecraft from earth, deployment in space, and potentially some amount of impact-related trauma once deployed. As a result, not only must an integrated circuit device used in space provide or be used in conjunction with a mechanism for preventing the exposure of the integrated circuit die to ionizing radiation in excess of its total dose tolerance, and provide or be used in conjunction with a mechanism for maintaining the temperature of the integrated circuit die within its temperature operating range, while at the same time maintaining or increasing the mechanical robustness of the integrated circuit package.

Another important aspect of integrated circuit devices that are sent into space is that such integrated circuit devices must be light weight enough to meet weight constraints inherent in integrated circuit devices that are launched from earth to space, e.g., earth orbit. Thus, in addressing the need for a mechanism for preventing the exposure of the integrated circuit due to ionizing radiation in excess of its total dose tolerance and the need for a mechanism for maintaining the temperature of the integrated circuit due within its operating range, and the requirement for mechanical robustness, the integrated circuit device for use in a space environment must be light weight.

Accordingly, in many radiation environments integrated circuit die must be shielded from radiation in order to function reliably. For example, as mentioned above, in a space environment, integrated circuit die must be, for example, shielded from ionizing radiation or the circuit may fail to function reliably. Additionally, the integrated circuit die may need to be shielded from, e.g., x-rays that can damage the circuit die, thus, causing it to fail or function unreliably. In a space environment, servicing, e.g., replacing a part that has failed or otherwise become unreliable is extremely expensive or alltogether impossible. Thus, an integrated circuit die to be used in a space environment should shielded from one or both of ionizing radiation and x-ray radiation in order to function reliably.

Always, when packaging integrated circuit die for use in a high radiation environment such as space, the size and weight of the package is a major concern both due to weight limitations inherent in a space launch and relationship between weight and inertial mechanical forces to which the electronic circuit device will be subjected. Thus, an integrated circuit device that is very bulky or heavy adds not only cost to the launch of the systems in which the integrated circuit device is used, but, perhaps more importantly, reduces the reliability of the integrated circuit device. For example, the integrated circuit device may become unreliable because the weight of the part results in more stress on solder joints within the integrated circuit device, such as solder joints that connect the integrated circuit device to the circuit board, or solder joints that affix the lid of the integrated circuit device package. Thus, a reduction in the weight of an integrated circuit device benefits the integrated circuit device not only in making it lighter, and thus reducing the weight of the system, but results in less stress on the solder joints, and thus increases the reliability of the integrated circuit device, and the system in which the integrated circuit device is employed.

Heretofore, multi-chip modules provided integrated circuit devices comprising a package, and multiple integrated circuit die within a single-layered integrated circuit device package. The multi-chip module needs enough shielding material, either in its package, externally, or both, to shield the most sensitive of the multiple integrated circuit die within the multi-chip module, in order to assure the reliability of the most sensitive integrated circuit die within the multi-chip module. The amount of shielding material necessary to effect this amount of shielding, results not only in an unacceptably high weight, but an unacceptably high cost, as elaborated upon below.

Additionally, the amount of external shielding material in a multi-chip module (or a single-chip integrated circuit device), particularly when the integrated circuit device is designed for sensitive integrated circuit die and/or harsh space environments, greatly reduces the consistency with which a hermetic seal between the lid of the integrated circuit package and the sidewalls or base of the integrated circuit package. As the amount, e.g., thickness, of the shielding material required becomes greater, the ability of manufacturing processes to achieve a hermetic seal between the lid and the sidewalls or base is becomes less. This is because the shielding material, in additional to providing shielding of the integrated circuit dice within the multi-chip module (or single-chip integrated circuit device), acts as a heat sink, thus affecting the soldering process used to achieve a hermetic seal between the lid and the sidewalls or base. A hermetic seal between the lid and sidewalls or base is important, however, as such hermetic seal keeps moisture and other chemical contaminants from infiltrating the integrated circuit device, and causing deterioration of the integrated circuit dice, thus causing failure of the integrated circuit device or a reduction in the reliability of the integrated circuit device.

The ability to obtain a hermetic seal also decreases as the size of the integrated circuit device package increases. Both the shielding material, such as may be used in the lid, and the material used for the sidewalls and/or base of the integrated circuit device package expand and contract in response to thermal variations at certain rates depending upon the materials employed. As the length of the seal between the lid and the sidewalls or base increases, the amount of the difference between the amounts of the expansion or contraction in response to thermal variations of the lid verses the sidewalls or base increases. This results in warping at the interface between the lid and the sidewalls or base, which, in turn, decreases the ability of manufacturing processes to obtain a hermetic seal because the stress and strain at such interfaces increases. As described above, this inability to achieve a lack of hermeticity is undesirable.

As will be readily appreciated by one of ordinary skill in the art, the problems described above, while attributed to integrated circuit devices designed for use in space environments, are present in other environments as well. Thus, the embodiments described below will be appreciated as having numerous applications beyond space applications. For example, thermal (heat) dissipation is a significant issue in high-volume, high-density devices. The embodiments described herein provide a significant improvement to heretofore known devices with respect to thermal dissipation.

Specifically, as the need for large amounts of memory, and other high-volume integrated circuit devices, has increased with the increase in complexity, processing capacity and processor bits, the need for compact memory storage devices, and other high-volume and high-density integrated circuit devices, has increased. Large amounts of circuitry, such as high-volume memory modules, produce large amounts of heat that can ultimately cause the high-volume memory modules to fail or otherwise become unreliable. Prior approaches to packaging high-volume, high-density memory modules involve stacking multiple memory chips in plastic packages on top of one another. Traditional plastic packaging of the memory chips does not provide enough heat dissipation for a high-reliability high-volume, high-density memory module. The lack of an ability to adequately dissipate heat leads to larger integrated circuit devices and less circuit density. Furthermore, the lack of ability to dissipate heat, leads to increased integrated circuit device failure or unreliability.

Thus there is a need for improved integrated circuit devices and methods to address the numerous problems articulated above, as well as others.

SUMMARY OF INVENTION

In various embodiments, the present invention advantageously addresses needs articulated above as well as other needs by providing a highly reliable multi-layered integrated circuit device.

In one embodiment, the present invention includes a radiation shielding integrated circuit device comprising a plurality of package layers comprising a circuit package; a radiation shielding base coupled to the circuit package; and a circuit die coupled to the radiation shielding base; a radiation shielding lid coupled to the plurality of package layers; and a plurality of pin connectors; wherein the circuit die are shielded from receiving an amount of radiation greater than the total dose tolerance of the circuit die; wherein the plurality of package layers are stacked on top of each other such that a bottom of a first package layer acts as a top of a second package layer.

In another embodiment, the invention can be characterized as a radiation shielding integrated circuit device comprising a plurality of package layers comprising a circuit package; a radiation shielding lid coupled to the circuit package; and a circuit die coupled to the circuit package; a radiation shielding base coupled to the plurality of package layers; and a plurality of pin connectors; wherein the circuit die are shielded from receiving an amount of radiation greater than the total dose tolerance of the circuit die; wherein the plurality of package layers are stacked on top of each other.

In yet another embodiment, the invention advantageously includes a method of shielding an integrated circuit device comprising forming a first package layer comprising a first radiation shielding base, a first circuit package and a first circuit die; forming a second package layer comprising a second radiation shielding base, a second circuit package and a second circuit die; coupling a bottom of the first package layer to a top of the second package layer; and coupling a lid to the first package layer.

BRIEF DESCRIPTION OF DRAWINGS

The present invention is illustrated by way of example and not limitation in the accompanying figures, in which like references indicate similar elements, and in which.

Figure 1:
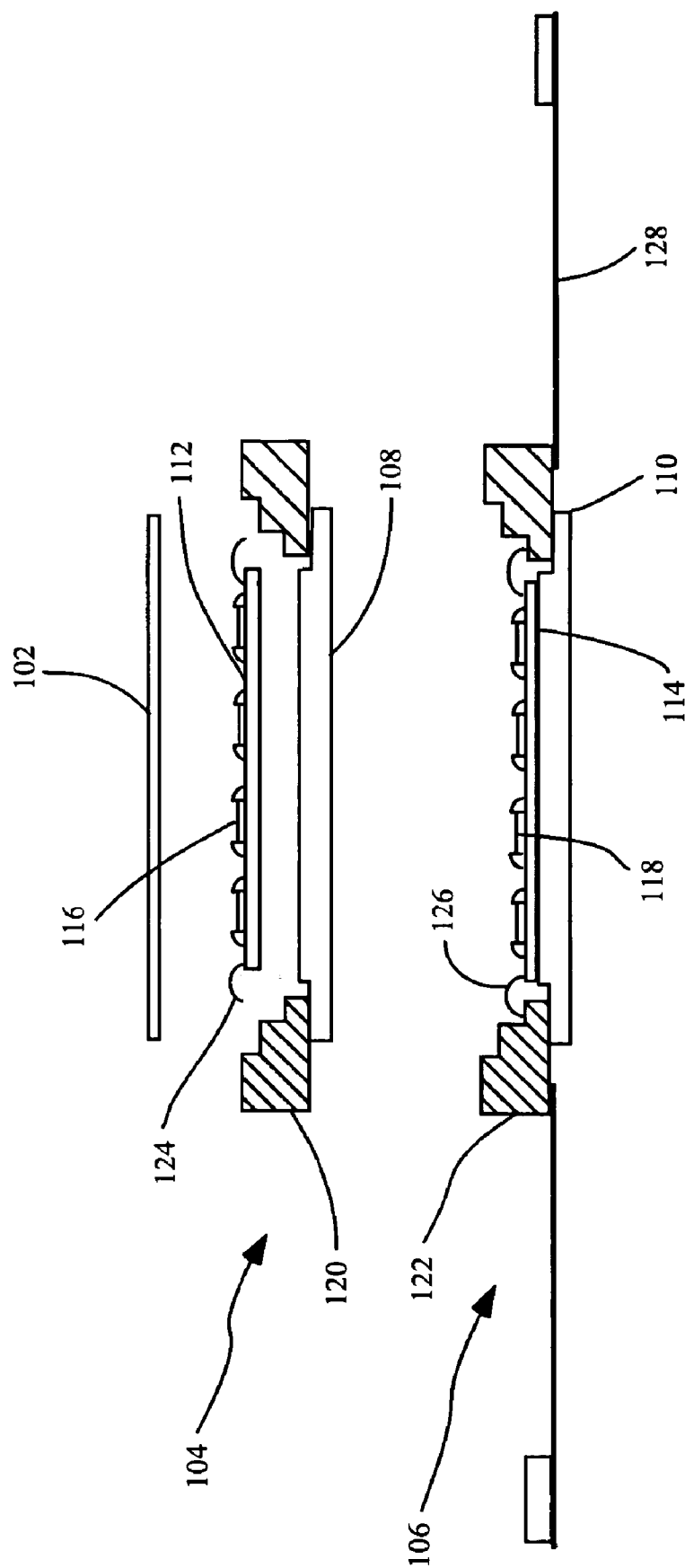
FIG. 1 illustrates a shielding package separated into layers designed to shield a plurality of electronic circuit die from radiation.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Advantageously, the present invention, in various embodiments, provides for a high-reliability integrated circuit device and integrated circuit device package therefore. The present embodiments provide an integrated circuit device package that protects integrated circuit die within the integrated circuit device package from at least one of: ionizing radiation, x-ray radiation, mechanical forces, thermal failure, and chemical contaminates. Additionally, the various embodiments can provide for a high-reliability integrated circuit device package that has high manufacturing yields.

In some embodiments, the present invention provides for a radiation shielding device and method that protects a plurality of integrated circuit die from radiation found in a apace environment. Radiation that comes into contact with an integrated circuit die can cause the integrated circuit die to fail or otherwise become unreliable. The radiation shielding shields the plurality of integrated circuit die from receiving an enfant of radiation greater than the total dose tolerances of each of the plurality of integrated circuit die within the integrated circuit device package. In some embodiments, a higher amount of shielding will be required for some of the plurality of integrated circuit die as compared to other integrated circuit die within the same integrated circuit device package. Advantageously, the present embodiments provide for a an integrated circuit device package with multiple shielding layers, wherein the integrated circuit dice that require a relatively larger amount of shielding as compared to other integrated circuit die within the package, when placed nearer to a center of the integrated circuit package, have multiple shielding layers protecting such integrated circuit dice from radiation. This provides for a highly reliable integrated circuit device package that protects a plurality of integrated circuit die from an amount of radiation greater than the total dose tolerances of each of the plurality of integrated circuit dice, while at the same time not paying the weight or size (footprint) "price" of heretofore known approaches. Because each of the integrated circuit die are protected from an amount of radiation greater than each of their total dose tolerances, the integrated circuit device is highly reliable in radiation environments, e.g., a space environment.

In other embodiments, the present invention provides for an integrated circuit device package and method that incorporates integrated circuit die that produce large amounts of heat. Advantageously, the integrated circuit device package of these embodiments serves as a heat sink, thus preventing the integrated circuit die from failure or otherwise becoming unreliable due to high operating temperatures. Generally, the high temperatures are caused by the integrated circuit die themselves, however, outside temperatures may also contribute to the high temperatures.

Advantageously, the present embodiments, provide for a high-volume, high-density memory module that can dissipate the heat generated by the integrated circuit die, e.g., a large amount of memory. The present embodiment is able to dissipate the heat by using at least one of a lid and a base of the integrated circuit device package as a thermal conductor. The present embodiments are able to dissipate large amounts of heat while taking up relatively little space on a circuit board as compared to other multi-layered devices.

Multi-layered devices generally are a group of integrated circuits packaged in a plastic packaging that have been stacked on top of each other and sold as, e.g., a memory module. Because the plastic casing is not efficient as a heat sink, in order for these packages to effectively dissipate heat, a relatively larger amount of thermal conductor is needed as compared to the present embodiments. In the present embodiments, the lid and/or base are made from a thermally conductive material. Thus, the thermally conductive base and/or lid present not only at the top and/or bottom of the integrated circuit device package, but also between each layer (or at least between two of the layers) of the integrated circuit device. As a result, heat dissipates through the thermal conductor not only from above and below the integrated device package, but also from between layers of the integrated circuit device. Thus, the thermally conductive base and/or lid allow for a large amount of heat dissipation as compared to a memory modulus encased in plastic packaging, and thus less thermal conductor is needed to dissipate heat allowing for a lighter, more compact multi-layered device.

Another advantage of a more compact multi-layered device is that it provides for an increased circuit density. Increased circuit density is desirable as a circuit device with vary short traces generally performs more quickly and reliably than a device with longer traces or with more discrete components connected with traces on a printed circuit board. The shorter the traces are, the less electromagnetic coupling and the less likelihood there will be a problem with the circuit trace. Thus, because the more compact multi-layered device of the present embodiments enables the use of shorter traces, the multi-layered device of the present embodiments is more reliable than prior devices.

Advantageously, the present embodiments provide high heat dissipation while reducing the size and weight of the package as compared to a single layered package containing the same amount of memory. By stacking the layers, the sire of both the lid and the base are greatly reduced. This is because the integrated circuit die are located above one another rather than adjacent to one another or side by side, thus taking up a smaller area and allowing for a smaller lid and base. The reduction in size also provides for great weight savings as in some embodiments the lid and the base are very dense material, thus, a reduction in the area of material used corresponds to a large amount of weight reduction. This provides for a smaller device while still having enough thermally conducting material used for the lid and/or base to effectively dissipate heat. In some embodiments, each layer of the device is connected through thermal vias (thermally conductive connections) to the lid and/or base, which allows for proper heat dissipation of all of the layers of the integrated circuit device package. In further embodiments, the integrated circuit device is also thermally connected to a board-level heat sink or system heat sink to allow further heat dissipation. Thus, the present embodiments advantageously provide for a memory module that can dissipate heat while greatly reducing the volume of the package and/or the area of the package (footprint) as compared to a single layer package containing the same amount of memory. In one preferred embodiment, the lid and/or base are made from Copper-Tungsten. In general the amount of copper tungsten needed for radiation shielding satisfies the heat dissipating requirements Advantageously, the integrated circuit device package of the present embodiments also has better manufacturing yields than single layer prior art package designs designed to hold a comparable amount of memory. One major contributor to the manufacturing yields is the ability to achieve a hermetic seal between the lid and the sidewalls or base or the integrated circuit package. The ability to achieve a hermetic seal is exponentially related to length of the seal. This is because the interface between too materials used for the lid and the sidewalls or base warps at a certain rate depending upon the materials used. At a certain point, there is too much warping, and the integrity of the solder at the interface fails under the forces causing such warping. As a result, the hermeticity of the interface is compromised. (This is also due to the materials not being able to lay flush against one another during the soldering process.) A single layered device having the same amount of memory as the embodiments described herein has a larger lid, i.e., lid with longer sides, than the lid of the present embodiments. Thus, the lid of the single layer device is more likely to have an amount of warping that will result in failure due to loss of hermeticity. Thus, the device of the present embodiment more consistently form a a hermetic seal between the lid and the sidewalls or base of the integrated circuit package. This increases the manufacturing yields of the embodiments described herein.

In yet ether embodiments a highly reliable package design is provided to protect a plurality of integrated circuit die within different layers of the package from an amount of radiation greater than a total dose tolerance of each of the plurality of integrated circuit die. In accordance with the present embodiments, the integrated circuit die on different layers of the package design can have different total dose tolerances and yet be protected from an amount of radiation greater than their total dose tolerance. The integrated circuit die with the smallest total dose tolerances are placed on the loser layers (furthest from the lid and base of the package) of the integrated circuit device package. This provides the more sensitive integrated circuit die with multiple layers of shielding sufficient to shield the more sensitive integrated circuit die with shielding sufficient to prevent the mote sensitive integrated circuit die from exposure to ionizing radiation in excess of the total dose tolerance of the more sensitive integrated circuit due, while at tins same time not shielding all integrated circuit die, many of which to not require this same amount of shielding, to the same degree. This provides for a high-reliability integrated circuit device for housing a plurality of integrate circuit die having different total dose tolerances, and being shielded in different amounts selected as a function of such total dose tolerances. As a result, a lighter, smaller area, more hermetic, more reliable integrated circuit device is provided.

In accordance with the present invention an exemplary method is provided for making a highly reliable package design that protects a plurality of integrated circuit die within different layers of the package from an amount of radiation greater than a total dose tolerance of each of the plurality of integrated circuit die. First, the total dose tolerances of the plurality of circuit die are determined. Second, the position of the plurality of circuit die within the highly reliable package design is determined. Generally, the circuit die with the largest total dose tolerance will be placed on either the top and the bottom layers of the package. A lid and base will then be selected with the proper amount and type of material such that the circuit die with the largest total dose tolerance will be shielded from an amount of radiation greater than its total dose tolerance. Next, a circuit die with a smaller total doss tolerance will be placed on one of the inner layers of the package. An inner shielding layer will then be selected taking into account the type and amount of material used for the lid and base. The amount and type of the inner shielding layer will be selected such that the circuit die with the smaller total dose tolerance is shielded from an amount of radiation greater than its total dose tolerance while taking into account the other shielding layers. This process is repeated for all remaining circuit die. Generally, The more sensitive circuit die are placed on the inner layers of the package such that the aggregate of all the shielding layers will provide the required amount of shielding needed to prevent the integrated circuit die failing or otherwise becoming unreliable. Thus, in accordance with the present embodiments, a method is provided for designing a package for a plurality of circuit die having different, wherein some of the circuit die may have different total dose tolerances.

In accordance with the embodiments, it should be understood that the package design is designed to be a high reliability part for operation, e.g., in space, military, and other high reliability consumer applications.

Referring to FIG. 1, a shielding package is shown separated into layers designed to shield a plurality of electronic circuit die from radiation. Shown is the radiation shielding lid 102, the first layer 104, the second layer 106, the first shielding base 108, the second shielding base 110, the first substrate 112, the second substrate 114, the first plurality of circuit die 116, the second plurality of circuit die 118, the first circuit package 120, the second circuit package 112, the first plurality of conductors 124, the second plurality of conductors 126, and the plurality of package leads 128.

Shown in FIG. 1 is a radiation shielding lid 102, a first layer 104, a second layer 106, a first shielding base 103, a second shielding base 110, a first substrate 112, a second substrate 114, a first plurality of integrated circuit die 116, a second plurality of integrated circuit die 118, a first circuit package 120, a second circuit package 122, a first plurality of conductors 124, a second plurality of conductors 126, and a plurality of package leads.

The radiation shielding lid 102 is coupled to the first circuit package 120 and the first shielding base 108 is also coupled to the first circuit package 120 forming a cavity for the first substrate 112 and the first plurality of circuit die 116. For the first plurality of circuit die 116 are coupled to the first substrate 112, which is coupled to the first shielding base 108. The first shielding base is coupled to the second circuit package 122. The second shielding base 110 is coupled to the second circuit package 122 forming the cavity for the second substrate 114 and the second plurality of circuit die 118. The second plurality of circuit die 118 are coupled to the second substrate, which is then coupled to the shielding base 110. The plurality of package leads 128 are also coupled to the second shielding base 110. The first plurality of conductors 124 and the second plurality of conductors 126 electrically connect to the first plurality of circuit die 116 into the second plurality of circuit die 118, respectively. The first plurality of conductors 124 and the second plurality or conductors 126 are electrically connected to the plurality of package leads 128.

Figure 2:
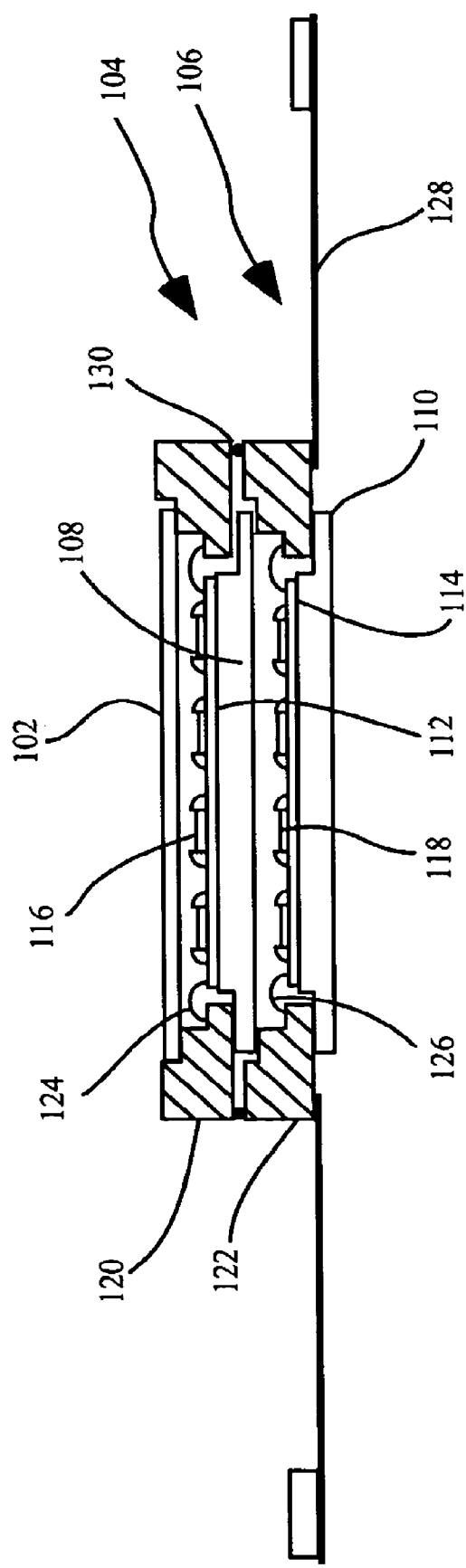
FIG. 2 illustrates the shielding package of FIG. 1 after the layers hare been assembled.

Referring next to FIG. 2, the integrated circuit device package of FIG. 1 is shown after the layers have been assembled is illustrated.

Shown is the radiation shielding lid 102, the first layer 104, the second layer 106, the first shielding base 108, the second shielding base 110, the first substrate 112, the second substrate 114, the first plurality of circuit die 116, the second plurality of circuit die 118, the first circuit package 120, tire second circuit package 122, the first plurality of conductors 124, the second plurality of conductors 126, the plurality of package reads 128 and a plurality of solder balls 130.

The radiation shielding lid 102 is coupled to the first circuit package 120. The first shielding base 108 is also coupled to the first circuit package 120 forming a cavity for the first substrate 112 and the first plurality of circuit die 116. The first plurality of circuit die 116 are coupled to the first substrate 112 which is coupled to the first shielding base 108. The first shielding base 108 is then coupled to the second circuit package 122. The plurality of solder balls 130 are used to bind the first circuit package 120 to the second circuit package 122. The second shielding base 110 is coupled to the second circuit package 122 forming a cavity for the second substrate 114 and the second plurality of circuit die 118. The second plurality or circuit die 118 are coupled to the second substrate 114 which is coupled to the second shielding base 110. The plurality of package leads 128 are also coupled to the second shielding base 110. The first plurality of conductors 124 and the second plurality of conductors 126 electrically connect to the first plurality of circuit die 116 and the second plurality of circuit die 118, respectively. The first plurality of conductors 124 and the second plurality of conductors 126 also are electrically connected to the plurality of package leads 128.

By stacking multiple layers, such as the first layer 104 and the second layer 106 together to form the integrated circuit device package, the area on the circuit board occupied by the integrated circuit device package is greatly reduced as compared to a package having only one layer. The weight of the package is also greatly reduced because the amount of material used for the radiation shielding lid 102, the first shielding base 108 and the second shielding base 110 is reduced, for example by 30%. The weight of the package is reduced by reducing the amount of shielding material used for the same number of integrated circuits. Advantageously, the amount of material can be reduced while still providing the same or comparable amount of shielding that is necessary for the integrated circuit device. An example of the reduction of shielding material is given below. The material used for the radiation shielding lid 102, the first shielding base 108 and the second shielding base 110 can be very dense, thus a 30% weight reduction is very significant to the overall weight reduction of the package. The percentage of weight reduction may be different in every design and the present invention should not be limited by a certain percentage of weight reduction.

As described above, the weight of a multi-layered integrated circuit package can be reduced by reducing the amount shielding material used for she integrated circuit device package. For example, a single layer device which is 4 inches by 4 inches could be packaged in a 4 layer device which measures 1½ inches by 1½ inches. This greatly reduces the amount of shielding material required even when using the same thickness for the radiation shielding lid 102 and the second radiation shielding base 110. For example, a single layer device would have two surfaces that required shielding material, the top and the bottom. Bach surface would have an area of 16 square inches (4 inches.times.4 inches). Thus, the total amount of shielding material would be 32 square inches (16 square inches+16 square inches). For the 4 layer device, 5 surfaces would require shielding material (the base, the lid, and three surfaces acting as both a base and a lid of an adjacent layers). Each surface would be 2.25 square inches (1.5 inches.times.1.5 inches). Thus, the total amount of shielding material for the 4 layer device would be 11.25 square inches (2.25 square inches.times.5). Thus, the total amount of savings is 20.75 square inches of shielding material (32 square inches-11.25 square inches).

The weight of the package can be further reduced by placing more sensitive circuit pares in the inner layers of the package. This provides the more sensitive circuit parts with increased shielding as radiation must pass through multiple layers of shielding material before reaching the circuit die. This allows for thinner shielding layers throughout the package and thus reduces the weight of the package. The inner layers or the multi-layered device can be reduced in thickness because of the cumulative effects of the shielding material on the radiation. The shielding material acts in a cumulative way in stopping radiation from traveling through it. The inner layers may be thinner because the integrated circuit die located on the inner layers already has a large amount of shielding provided by the lid and base. Thus, the inner layers simply provide even more shielding. As much of the radiation has already been stopped by the lid or base, only a thin layer may be required to shield the integrated circuit die located on the inner layers from an amount of radiation greater than the total dose tolerance of the integrated circuit die. While this does not reduce the area of the shielding layers is does further reduce the weight of the multi-layered package.

In addition to reducing the weight of the package, the shielding package of the present invention is much more reliable as compared to a singles layer multi-chip module. In a single layer device, the top and bottom of the device must provide enough shielding for the most sensitive circuit die in the package. Thus, the entire package must have a thick enough lid 102 and base 110 to protect the most sensitive circuit die from radiation. This prevents the most sensitive circuit die from receiving an amount of radiation greater than the total dose tolerance of the most sensitive circuit die. Thus, a single layer package can have more shielding material in the lid and base as compared to a multi-layered device which can place the more sensitive circuit die on the inner layers, thus providing it with multiple layers of shielding. As the amount of shielding material in the lid 102 increases, for example, the ability to achieve a hermetic seal between the lid 102 and the first circuit package 120 decreases. This is because the lid 102 functions as a heat sink which interferes wish the solder re-flow process used to attach the lid 102 to the first circuit package 120. As a result, the hermeticity of the package may be compromised because the lid will not properly solder to the first circuit package. As described above, if the hermeticity of the package is compromised, moisture or other chemicals may come in contact with the integrated circuit die and cause it to fail or otherwise become unreliable. Thus, a multi-layer device will be much more reliable than a single layer device as the hermeticity of the package is much less likely to be compromised.

Thus, because the integrated circuit package device of the present invention can use the combined shielding effects of the multiple layers to shield the most sensitive integrated circuit die within the integrated circuit package, i.e., the radiation shielding lid 102, the first shielding base 108 and the second shielding base 110, the thickness of the radiation shielding lid 102, the first shielding base 108 and the second shielding base 110 can be much thinner than that of the lid of a single layer device, therefore reducing the problem of achieving a hermetic seal as the lid will properly solder to the integrated circuit package. This achieves a highly reliable integrated circuit package device in scoot sauce with the present invention.

Another problem with increasing the thickness of the radiation shielding of a single layer device (to provide a sufficient amount of shielding) is the radiation shielding lid is made from a very dense material which attaches to the ceramic package. When the radiation shielding lid is very thick it tends to crack the ceramic package and the ability to achieve a hermetic seal is greatly decreased. When the radiation shielding lid is very thick, as the shielding material expands and contracts with changes in temperature, it exerts a large amount of force on the ceramic packaging that can cause cracks in the ceramic packaging and thus failure of the hermetic seal. The more material that is used for the lid, the more force will be put on the ceramic packaging. Therefore, by providing a multi-layer device, the present invention eliminates the need to have very thick layers for any of the radiation shielding lid 102, the first shielding base 108 and the second shielding base 110, as the cumulative effect of bun radiation shielding lid 102, the first shielding base 108 and the second shielding base 110 will shield the most sensitive circuit die by placing it on one of the inner-layers of the package. This reduction in the thickness of the radiation shielding lid 102, the first shielding base 108 and the second shielding bass 110 reduces the pressure on the ceramic packaging and reduces the likelihood the ceramic package will crack causing a failure of the device and failure of the hermetic seal.

In order to fit a large number of integrated circuit die into a single layer device, the area on the circuit board the device occupies must be substantially larger than the multi-layered device of the present invention. This is because each integrated circuit die needs a certain amount of space to attach to the substrate. If there are multiple substrates stacked on top of each other, each substrate can be smaller than a single substrate as in a single layer device and still provide enough of an area to attach all of the integrated circuit die. Thus, the overall area of the integrated circuit device package is reduced. Thus the embodiments provide for an integrated circuit device package which takes up less area on a circuit board.

In addition to taking up less space on a circuit board the reduction in size also reduces the length of the each side of the multi-layered device as compared to a single layer device having the same number of integrated circuit die. As the length of each side of the multi-layered device decreases, the ability to obtain a hermetic seal between the integrated circuit package and the radiation shielding lid 102 increases exponentially. This is due to the properties of the integrated circuit package and the radiation shielding lid 102. The integrated circuit package is generally made from a ceramic material. Ceramic warps at a rate of 3 mils/inch, thus as the length of the side increases, the ability to ensure a hermetic seal decreases exponentially. Thus, the larger the package, the lower the manufacturing yields will be and the more the part will fail. Thus, by having a multi-layered device, the length of the sides of the package is greatly reduced creating a much more reliable package.

In one embodiment of the present invention the first layer 104 is comprised of she first radiation shielding base 108, the first circuit package 120, the first substrate 112, and the first plurality of circuit die 116. The second layer 106 is comprised of the second radiation shielding base 110, the second circuit package 122, the second substrate 114, and the second plurality of circuit die 118. Advantageously, as shown in FIG. 2, the bottom of the first layer 104 forms a lid for the second layer 106. The first radiation shielding base 110 then acts to shield the second plurality of circuit die 118 from radiation. Advantageously, additional layers could be easily added to the shielding package. Thus, the present invention can easily be manufactured with more than two layers. If an additional layer is desired, another layer which is the same as the first layer 104 is put on top of the first layer 104. The additional layer will have a base which will act as the top of the first layer. The radiation shielding lid will then be placed on the additional layer, forming the top of the entire package, now having three layers. When two or more layers are present, the radiation shielding base 322 is coupled to the top-most layer, e.g., in FIG. 2 the first layer 104. Additionally, the plurality of package leads 128 are then coupled to the bottom-most layer, e.g., in FIG. 2 the second layer 106. Alternatively, the plurality of package leads 128 could be coupled to a different layer.

The radiation shielding lid 102, the first shielding case 108 and the second shielding base 110 shield the first plurality of circuit die 116 and the second plurality of circuit die 118 from radiation. The radiation shielding lid 102, the first shielding base 108 and the second shielding base 110 are designed such that the first plurality of circuit die 116 and the second plurality of circuit die 118 are not exposed to an amount of radiation greater than the total dose tolerances of the first plurality of circuit die 116 and the second plurality of circuit die 118. Such design is achieved by determining a thickness of the radiation shielding lid 102, the first shielding base 108, and the second shielding base 110, based on the material selected for the radiation shielding lid 102, the first shielding base 108, and the second shielding base 110, the space (or other radiation) environment in which the integrated circuit device package is to be used, and the total dose tolerance of each of the integrated circuit die to be shielded.

Figure 3:
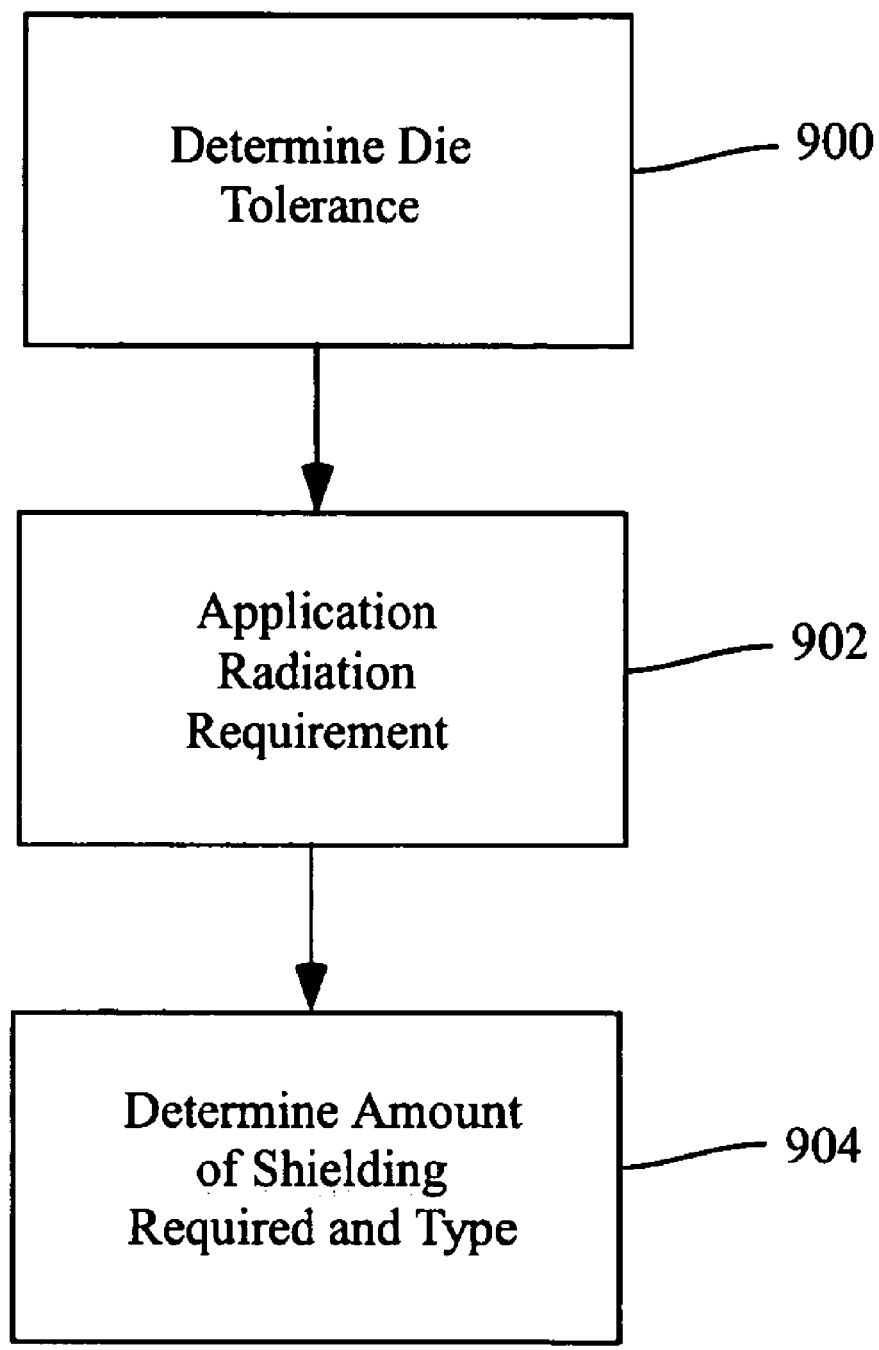
FIG. 3 is a flow chart showing a method of determining an amount of shielding needed for a layered shielding package in accordance with the present invention.

Referring next to FIG. 3, a method for determining the material and thicknesses of the radiation shielding lid 102, the first shielding base 108 and she second shielding bass 110 is shown. First, the total dose tolerances of the first plurality of circuit die 116 and the second plurality of circuit die 118 are determined 900. This test can be accomplished by a Cobalt-60 source or other penetrating irradiation source. Without the knowledge of what the inherent radiation tolerance is for the individual semiconductor device, the designer does not know how much or whether shielding is necessary.

Second, the radiation environment to which the first plurality of circuit die 116 and the second plurality of circuit die 118 will be exposed to is determined 902. This involves determining the radiation spectrum and dose depth curve of the particular mission or radiation requirement of the application. For orbits around the earth, this is calculated using conventional radiation transport codes in conjunction with conventional radiation spectrum tables. Alternatively, any known radiation environment can be modeled and subsequently a dose depth curve created for the modeled environment.

The next step 904 involves determining the thickness and material of the radiation shielding lid 102, the first shielding base 106 and the second shielding base 110 such that the first plurality of circuit die 116 and the second plurality of circuit die 118 will not be exposed in the determined radiation environment to an amount of radiation greater than the total dose tolerances of the first plurality of circuit die 116 and the second plurality of circuit die 118. Once yon know the total dose tolerances of the first plurality of circuit die 116 and the second plurality of circuit die 118 and the dose depth curve of the radiation environment, the amount of shielding required can be determined to bring the first plurality of circuit die 116 and the second plurality of circuit die 118 within the tolerance. Thus, the radiation shielding lid 102, the first shielding base 108 and the second shielding base 110 are designed to be of a sufficient thickness to shield the first plurality of circuit die 116 and the second plurality of circuit die 118 from an amount of radiation greater than the total dose tolerances of the first plurality of circuit die 116 and the second plurality of circuit die 118. A suitable process for determining shielding thickness in accordance with the present embodiment is described in U.S. Pat. No. 6,261,508, of Featherby et al., for a METHOD FOR MAKING A SHIELDING COMPOSITION, incorporated herein by reference as if set forth in its entirety.

Another method in accordance with the present invention involves using the above mentioned modeling code to generate a dose versus depth curve in which the amount of shielding required to bring the total dose level under the first plurality of circuit die 116 and the second plurality of circuit die 118 total dose tolerance levels is determined. The package shielding is then analyzed by comparing the amount of radiation from all directions and the amount of shielding that is supplied from each of those directions. The radiation at the first plurality of circuit die 116 and the second plurality of circuit die 118 level is the summation of all the different angles normalized fox the package area.

Advantageously, the radiation shielding lid 102, the first shielding base 108 and the second shielding base 110 can be termed from a high Z material such as osmium, iridium, platinum, tantalum, gold, and tungsten. In general, any high Z material may be employed having an atomic number of 50 and above. More preferably, the range of atomic numbers can be between 60 and 100, inclusive. The most preferred range of atomic numbers is between 73 and 79, inclusive.

Alternatively, the radiation shielding lid 102, the first shielding base 108 and the second shielding bass 110 can be made from a multiple layer shielding composition comprising a high a layer and a low Z layer. Advantageously, the radiation shielding lid 102, the first shielding base 108 and the second shielding base 110 can be made from a multiple layer shielding composition comprising a high Z layer interposed between an outer row Z layer and an inner low Z layer. This configuration is an optimal shielding geometry for a geosynchronous orbit. The high Z layer is effective in stopping electrons and Bremsstrahlung radiation, while the low Z material is more effective in stopping protons. A geosynchronous orbit is dominated by trapped electrons, so it is preferable that the high Z layer is thicker than the two low Z layers.

The low Z layer is preferably selected from the group consisting of copper, nickel, carbon, titanium, chromium, cobalt, boron, silicon, iron and nitrogen. In general, any suitable low Z material may be employed having an atomic number of 30 and below, but the most preferred low Z materials are selected from the group consisting of copper, nickel, carbon, iron, titanium, silicon, and nitrogen. This packaging is further described in U.S. Pat. No. 6,262,362 B1, of Czjakowski et al., for RADIATION SHIELDING OF THREE DIMENSIONAL MULTI-CHIP MODULES, incorporated herein by reference as if set forth in its entirety. In one preferred embodiment, the radiation shielding lid 102, the first shielding base 108 and the second shielding base 110 are made from Copper-Tungsten.

In addition to acting as a radiation shield, the radiation shielding lid 102, the first shielding base 108 and the second shielding base 110 also act as a heat sink for the entire shielding package. This helps to prevent the first plurality of circuit die 116 and the second plurality of circuit die 118 from overheating and causing a failure of the first plurality of circuit die 116 or the second plurality of circuit die 118. In an alternative embodiment, the package in designed for use as a high reliability part, such as in military or aviation applications. In this embodiment, the radiation shielding lid 102, the first shielding base 108 and the second shielding base 110 are primarily used to dissipate heat away from the package, thus allowing the circuit die to operate in accordance within the specified temperature range for the circuit die. In this embodiment, the radiation shielding lid 102, the first shielding base 108, and the second shielding base 110 are made from a thermally conductive material. In an embodiment where the package device is not exposed to a large amount of radiation, the radiation shielding lid 102, the first shielding base 108 and the second shielding base 110 need only be made from a thermally conductive material. The radiation shielding properties of the thermally conductive material need not be considered in an environment where radiation is not a concern.

For example, one embodiment of the present invention includes a memory module containing twelve circuit die that operates at 15 watts. The present embodiment provides a high reliability part that can dissipate the heat generated by the memory module such that the circuit die can operate within a recommended temperature range. One example of this type of device is an SDRAM memory module. Using 256 megabit SDRAM die, a module can provide 500 megabits of memory per layer, thus allowing 500 megabits, 1 gigabit, 1.5 gigabits, and 2 gigabits by stacking one, owe, three or four layers respectively, while not growing the circuit board space required. In the example of eeprom die, one, two, three, or four layers can provide 8 megabits, 16 megabits, 32 megabits, and 48 megabits of memory respectively. In general, the memory is doubled every two layers.

The plurality of solder balls 130 interconnect the first layer 104 and the second layer 106. These connections are then electrically connected to the plurality of package leads 128. The first layer 104 and the second 106 layer shown in FIG. 1 and FIG. 2 are non-hermetic layers individually. When the package is put together the base of the first layer 104 is attached to a moralized surface of the second layer 106 using solder and thus forming a hermetic seal for the second layer 106. A lid is then attached to the first layer 104 in order to complete a hermetic seal for the first layer 104. This allows the first shielding base 108 to act as both a lid and a base for the two layers making the entire package considerably thinner as compared to a multi-layered device without the shared shielding layer.

The first substrate 112 and the second substrate 114 can be either a high temperature cofired substrate, a low temperature cofired substrate or a thick film substrate. The first substrate 112 and the second substrate 114 are made from the same type of alumina, but the processing of each is different. In accordance with a preferred embodiment, the high temperature cofired substrate is used as it is the most robust of the three types of substrates.

The first substrate 112 and the second substrate 114 are attached to the first layer 104 and the second layer 106 using cyanate ester. Alternatively, in applications which require a large amount of heat dissipation a sliver glass or silver epoxy can be used in order to provide a more thermally conductive connection.

In a preferred embodiment, the first layer 104 and the second layer 106 are attached using a high temperature solder (Au/Sn). The first radiation shielding lid 102 is also attached using the high temperature solder in order to have the same coefficient of thermal expansion. This prevents the package from experiencing traditional solder joint fatigue and cracking failure that other solders may experience. The high temperature solder withstands thermal cycling which prevents the failure of the solder joints of the package. Alternatively, the package layers may be attached using a Pb/Sn alloy, solder wires or a conductive epoxy. However, in environments that may experience high mechanical strain, it is preferred to use the high temperature solder, as this will prevent failure of the package.

In accordance with one embodiment of the present invention a seal ring (not shown), which is used to seal the radiation shielding lid 110 to the circuit package 120 can be adjusted in height. This provides for a means of adjusting the space within each layer. Advantageously, this feature can be used when a larger height is needed for the plurality of circuit die within each layer of the shielding device.

Figure 4:
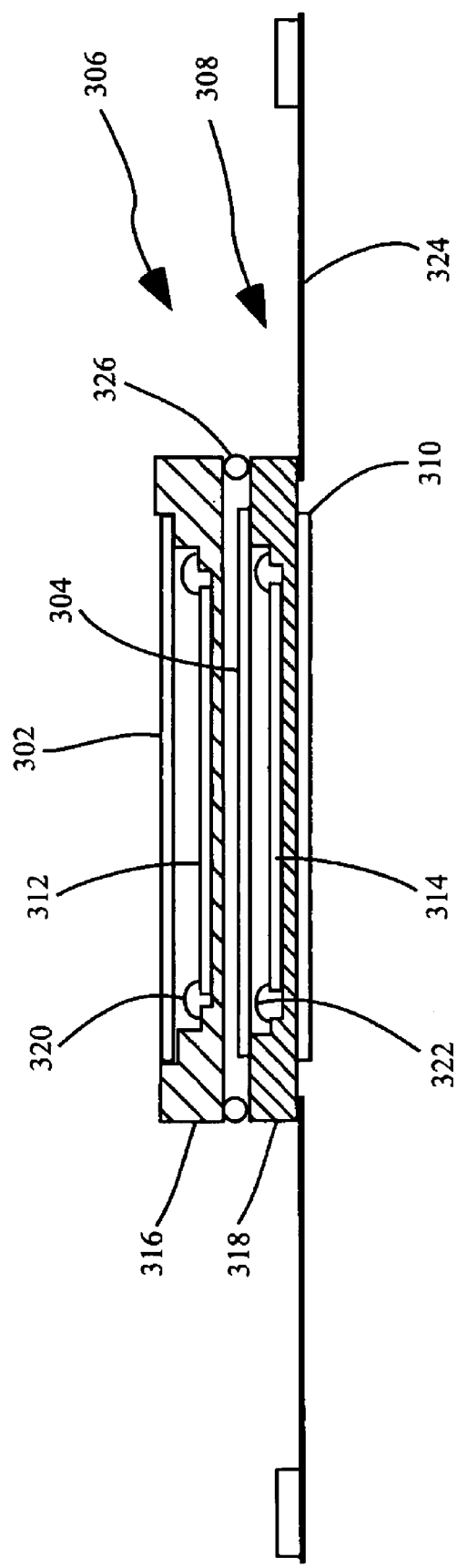
FIG. 4 illustrates a layered shielding package designed to shield from radiation a plurality of electronic circuit die mounted directly to a ceramic package

Referring next to FIG. 4 a layered shielding package is shown designed to shield a plurality of electronic circuit die mounted directly to a ceramic package from radiation.

FIG. 4 shows a first radiation shielding lid 302, a second radiation shielding lid 304, a first layer 306, a second layer 308, a shielding base 310, a first circuit die 312, a second circuit die 314, a first circuit package 316, a second circuit package 318, a first plurality of conductors 320, a second plurality of conductors 322, a plurality of package leads 324, and a plurality of solder balls 326.

The first radiation shielding lid 302 is coupled to the first circuit package 316 forming a cavity for the first circuit die 312. The first circuit die 312 is coupled to the first circuit package 316. The second shielding lid 304 is coupled to the second circuit package 318 forming a cavity for the second circuit die 314. The second circuit die 314 is coupled to the second circuit package 318. The shielding base 310 is then coupled to a bottom of the second circuit package 318. Additionally, the plurality of package leads 324 are also coupled to the shielding base 310. The first plurality of conductors 320 and the second plurality of conductors 322 electrically connect to the first circuit die 312 and the second circuit die 314, respectively. The first plurality of conductors 310 and the second plurality of conductors 312 also are electrically connected to the plurality of package leads 324. The plurality of solder balls 326 couple the first circuit package 316 to the second circuit package 318.

In one embodiment the first layer 306 is comprised of the first initiation shielding lid 302, the first circuit package 316, and the first circuit die 312. The second layer 308 is comprised of the second radiation shielding lid 304, the second circuit package 318, and the second circuit die 314. Advantageously, the second radiation shielding lid 304 of the second layer 308 forms a bottom shielding layer for the first circuit die 312 in the first layer 306. The radiation shielding base 310 then acts in combination with the second radiation shielding lid 304 to shield the second circuit die 314 from radiation. Advantageously, additional layers could be easily added to the shielding package. Thus, the present invention can easily be manufactured with more than two layers. When two or more layers are present the radiation shielding base 310 is coupled to the bottom most layer, e.g., in FIG. 4 the second layer 308. Additionally, the plurality of package leads 324 are then coupled to the bottom most layer, e.g., in FIG. 2 the second layer 106. Alternatively, the plurality of package leads 324 could be coupled to a different layer.

The first radiation shielding lid 302, the second radiation shielding lid 304, and the shielding base 306 are all high Z material or alternatively layers of high Z and low Z material as describe above with reference to FIG. 1 and FIG. 2. The first radiation shielding lid 302, the second radiation shielding lid 304, and the shielding base 306 have thicknesses chosen to shield the first circuit die 312 and the second circuit die 314 from radiation. The thicknesses are determined such that the first circuit die 312 and the second circuit die 314 are not exposed to an amount of ionizing radiation grantor than the total dose tolerances of the first circuit die 312 and the second circuit die 314. This process is described above with reference to FIG. 1 and FIG. 2.

The first layer 306 and the second layer 308 are hermetically sealed layers. This prevents moisture or other compounds and chemicals from coming in contact with the circuit die. This prevents failure of the circuit device. For example, water can erode the circuit die or attract silver which can lead to a short in the circuit die. The present invention reduces the length of the hermetic seal as compared to a single layer device. This greatly increases the reliability of the hermetic seal and prevents failure of the device.

Figure 5:
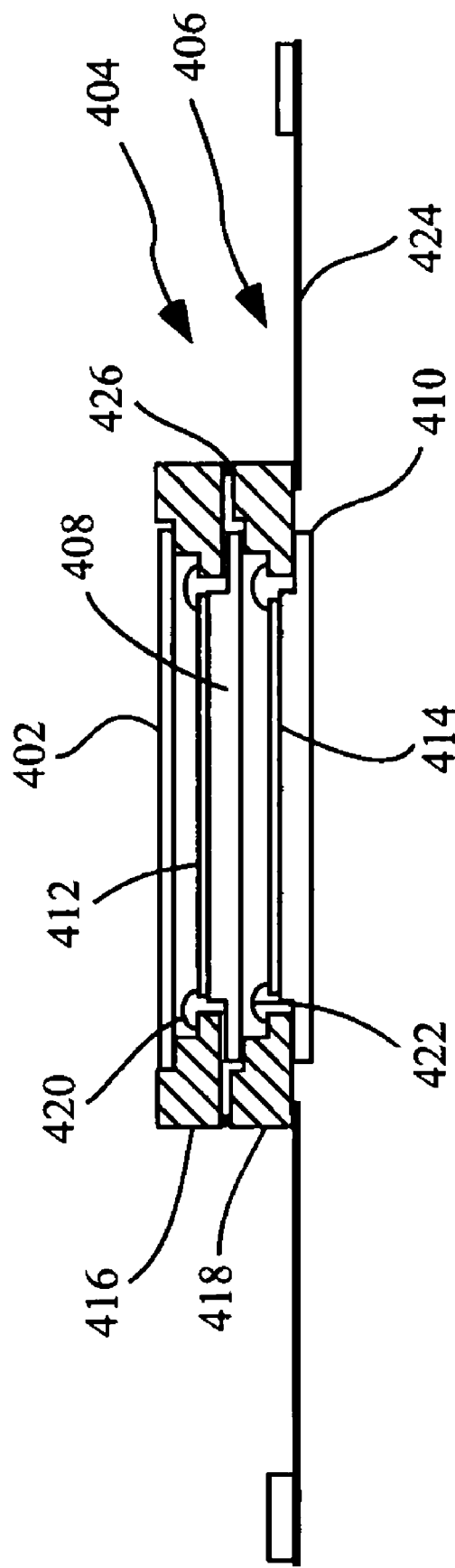
FIG. 5 illustrates a layered shielding package designed to shield from radiation a plurality of electronic circuit die mounted directly to a shielding layer.

Referring to FIG. 5 a multi-layer shielding package is shown for shielding a plurality of electronic circuit die mounted directly to a shielding layer.

FIG. 5 shows a radiation shielding lid 402, a first layer 404, a second layer 406, a first shielding base 408, a second shielding base 410, a first circuit die 412, a second circuit die 414, a first circuit package 416, a second circuit package 418, a first plurality of conductors 420, a second plurality of conductors 422, a plurality of package leads 424, and a plurality of solder balls 426.

FIG. 3 is similar in function and structure to FIG. 2. However, FIG. 5 shows a first circuit die 416 attached to the first radiation shielding base 408 and the second circuit die 418 attached to the second radiation shielding base 410. The first layer 404 comprises the first circuit package 416, the first shielding base 408, the first circuit die 412, and the first plurality of conductors 420. The second layer 406 comprises the second circuit package 418, the second shielding base 410, the second circuit die 414, and the second plurality of conductors 422. Advantageously, the first radiation shielding base 408 acts as a lid for the second layer 406. Additionally, the radiation shielding lid 402 is coupled to the first layer 404 and the plurality of package leads 424 are coupled to the second layer 406. The plurality of solder balls 426 attaches the first layer 404 to the second layer 406.

Figure 6:
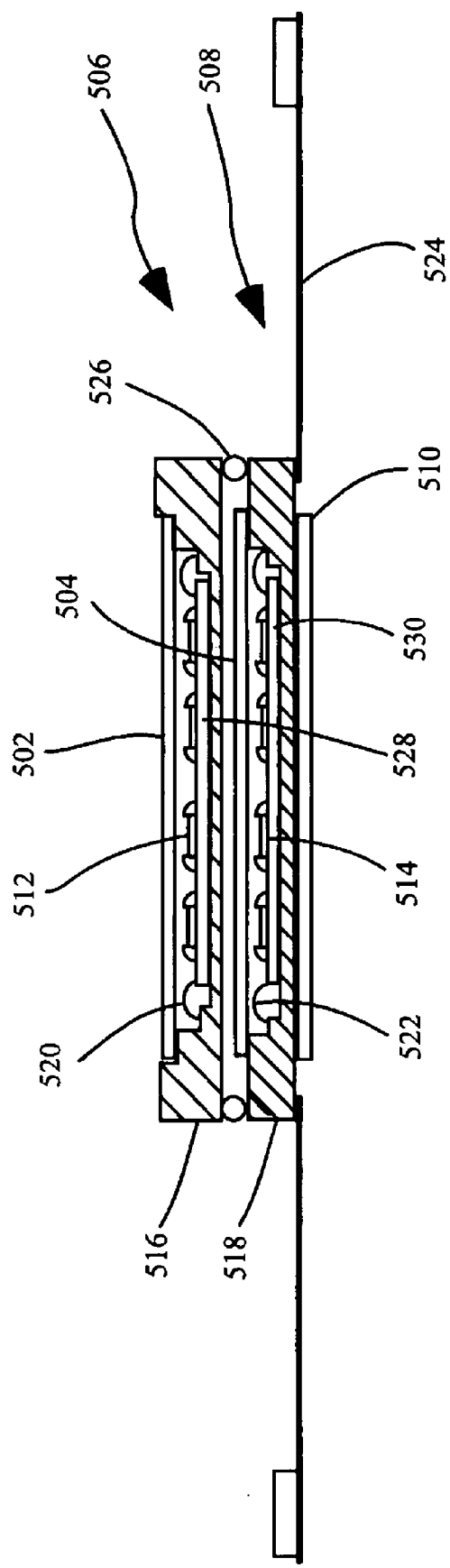
FIG. 6 illustrates a layered shielding package designed to shield from radiation a plurality of electronic circuit die mounted directly to a substrate.

Referring to FIG. 6 a layered shielding package designed is illustrated to shield from radiation a plurality of electronic circuit die mounted directly to a substrate.

FIG. 6 shows a first radiation shielding lid 502, a second radiation shielding lid 504, a first layer 506, a second layer 508, a shielding base 510, a first plurality of circuit die 512, a second plurality of circuit die 514, a first circuit package 516, a second circuit package 518, a first plurality of conductors 520, a second plurality of conductors 522, a plurality of package leads 524, a plurality of solder balls 526, a first substrate 528, and a second substrate 530.

FIG. 6 is similar in function and structure to FIG. 4. However, FIG. 6 shows the first substrate 528 and the second substrate 530 coupled to the first circuit package 516 and the second circuit package 518, respectively. The first plurality of circuit die 514 and the second plurality of circuit die 516 are coupled to the first substrate and the second substrate 530, respectively.

Figure 7:
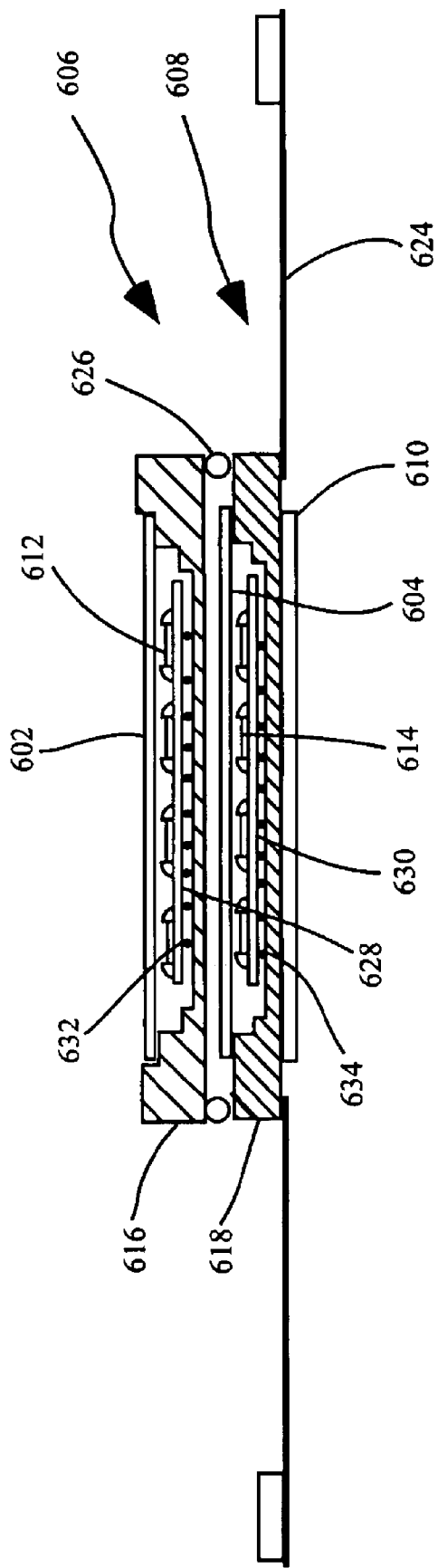
FIG. 7 illustrates a layered shielding package designed to shield from radiation a plurality of electronic circuit die mounted directly to a substrate.

Referring to FIG. 7 a layered shielding package is shown designed to shield from radiation a plurality of electronic circuit die mounted directly to a substrate.

FIG. 7 shows a first radiation shielding lid 602, a second radiation shielding lid 604, a first layer 606, a second layer 608, a shielding base 610, a first plurality of circuit die 612, a second plurality of circuit die 614, a first circuit package 616, a second circuit package 618, a plurality of package leads 624, a plurality of solder balls 626, a first substrate 628, a second substrate 630, a first plurality of substrate solder balls 632 and a second plurality of substrate solder balls 634.

FIG. 7 is similar in function and structure to FIG. 6. However, FIG. 7 shows the first substrate 628 attached to the first circuit package 616 with the first plurality of solder balls 632. The second substrate 630 is attached to the second circuit package 618 with the second plurality of solder balls 634.

Figure 8:
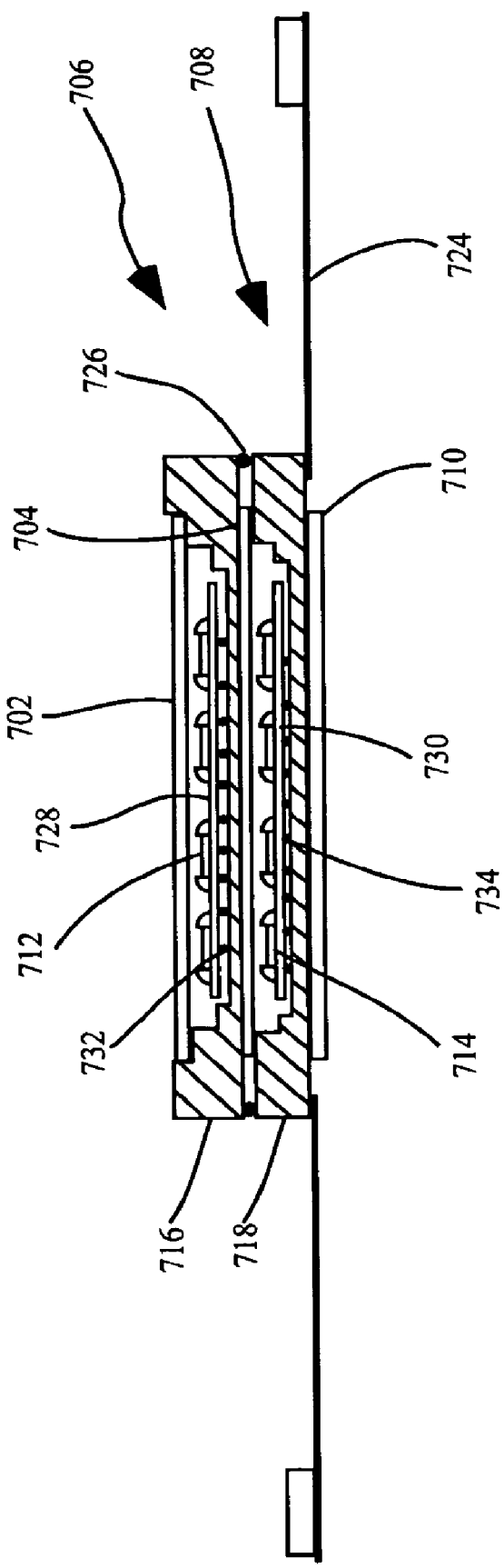
FIG. 8 illustrates a layered shielding package designed to shield from radiation a plurality of electronic circuit die mounted directly to a substrate.

Referring to FIG. 8 a layered shielding package is shown designed to shield from radiation a plurality of electronic circuit die mounted directly to a substrate.

FIG. 8 shows a first radiation shielding lie 702, a second radiation shielding lid 704, a first layer 706, a second layer 708, a shielding base 710, a first plurality of circuit die 712, a second plurality of circuit die 714, a first circuit package 716, a second circuit package 718, a plurality of package leads 724, a plurality of solder balls 726, a first substrate 728, a second substrate 730, a first plurality of substrate solder balls 732 and a second plurality of substrate solder balls 734.

FIG. 8 shows a first radiation shielding lie 702, a second radiation shielding lid 704, a first layer 706, a second layer 708, a shielding base 710, a first plurality of circuit die 712, a second plurality of circuit die 714, a first circuit package 716, a second circuit package 718, a plurality of package leads 724, a plurality of solder balls 726, a first substrate 730, a second substrate 728 a first plurality of substrate solder balls 732 and a second plurality of substrate solder balls 734.

In this embodiment, thermal vias, such as described with reference to FIG. 9 can be used to thermally connect the first radiation shielding lid 702, the second radiation shielding lid 704 and the shielding base 710. The shielding base 710 can then be connected to a large heat-sink for the circuit board. Alternatively, the first radiation shielding lid can be connected to the large heat sink.

Additionally, each layer shown in FIG. 8 is hermetic. Ceramic material is used for the first layer 706 and the second layer 708. Thus, no moisture is allowed into the space containing the first plurality of circuit die 712 and the second plurality of circuit die 714. This prevents failure of the circuit die. If moisture where to come in contact with either or the first plurality or circuit die 712 and the second plurality of circuit die 714, the circuit may fail. Additionally, moisture can induce the migration of silver from conductors or component terminations, which can result in a short circuit and device failure. During the manufacturing process the non-sealed package is exposed to a high temperature bake-out procedure to remove any moisture or residual gasses and is then sealed.

Figure 9:
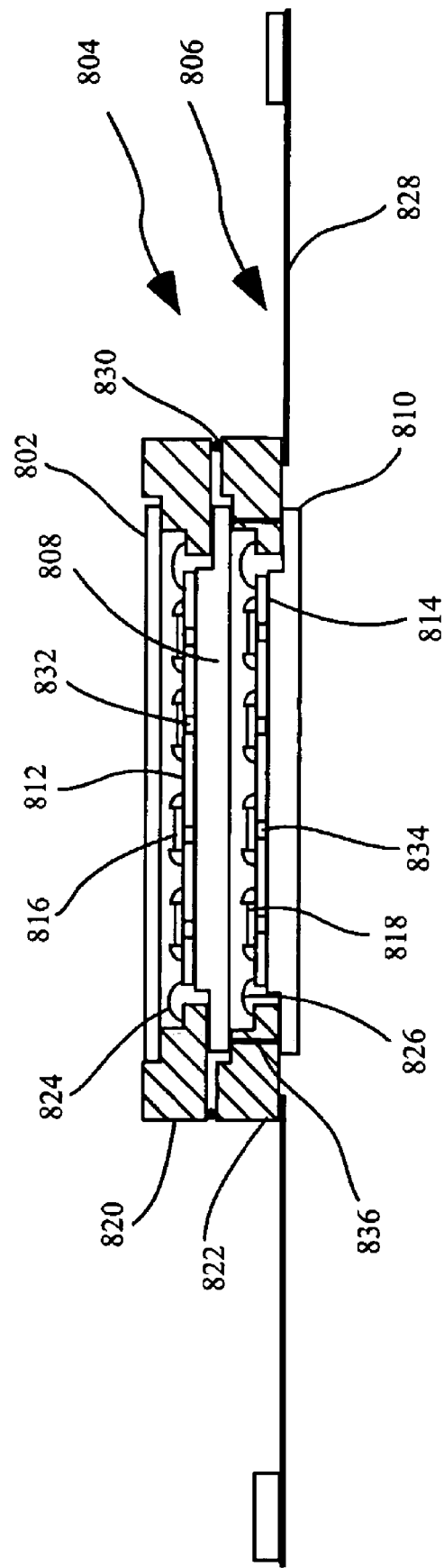
FIG. 9 illustrates a package for dissipating heat from a plurality of circuit die.

Referring to FIG. 9 a package device is shown for dissipating heat from a multi-layered package containing a plurality of circuit die.

FIG. 9 shows a lid 802, a first layer 804, a second layer 806, a first base 808, a second base 810, a first substrate 812, a second substrate 814, a first plurality of circuit die 816, a second plurality of circuit die 818, a first circuit package 820, a second circuit package 822, a first plurality of conductors 824, a second plurality of conductors 826, a plurality of package leads 828, a plurality of solder balls 830, a first plurality of thermal vias 832, a second plurality of thermal vias 834 and a plurality of thermal layer connectors 836.

The plurality of solder balls 330 is used to electrically connect the first plurality of circuit die 816 with the second plurality of circuit die 818. Alternatively, a plurality of castellation are used to connect the first plurality of circuit die 816 and the second plurality of circuit die 818, however, in applications which require a high circuit density, the plurality of solder balls is preferred.

The first plurality of thermal vias 832 and the second plurality of thermal vias 834 are fed through the first substrate 812 and the second substrate 814 respectively. Advantageously, the first plurality of thermal vias 832 and the second plurality of thermal vias 834 are connected to the first plurality of circuit die 816 and the second plurality of circuit die 818 respectively. They are then fed through the first substrate 812 and the second substrate 814 and connected to one or more of the lid 802, the first base 808 and the second base 810. The lid 802, the first base 808 and the second base 810 can also be interconnected through the thermal layer connectors 836. In this embodiment, the second base acts as the principle heat sink and can be attached to a system heat sink. This allows for heat to dissipate from the first plurality of circuit die 816 and the second plurality of circuit die 818. The plurality of thermal layer connectors 836 connects the first plurality of thermal vias 832 and the second plurality of thermal vias 834 to the second base 810 which acts as a heat sink for the entire package. When used in s system which has a large system heat sink, the second shielding base 810 could be connected to the large system heat sink. Advantageously, the thermal vias could be utilized in any of the previously disclosed embodiments.

In one embodiment, the package device operates as a memory module. Thus, the device is capable of containing large amounts of memory in a relatively small space. The design of the package allows for the dissipation of the large amount of heat generated by the plurality of circuit die.

The heat sink feature of the present invention can also be utilized in a space environment. Providing the circuit die with a good heat sink is very important in a space environment to ensure the reliability of the part. In a space environment there is the additional problem of having no airflow over the device in order to help control the heat. Thus, having a good heat sink is very can be very important in preventing a circuit die from operating within a given temperature range of the circuit die.

In accordance with the embodiments of FIGS. 1-9, electrical redundancy can be built into the multi-layered package. For example, redundant electronic circuit die can be placed on different layers of the multi-layer package. Thus, if one of the layers fails because of hermetic seal failure, temperature failure, mechanical failure, or radiation failure the backup device will still be operable. This prevents failure of the entire package. In one example a circuit die on the top layer may fail do to an unexpected amount of radiation, however, the redundant circuit die on the second layer would not fail because of the extra layer of shielding.

Additionally, the embodiment shown in FIGS. 1-9 allow for a device which has a fully traceable circuit die. Different lots of circuit die has different radiation shielding tolerance, thus by having a device which can be traced by lot allows for a high reliability part. If one of the circuit die fail, it can be traced back to the manufacture and all the other parts with circuit die from the same lot can be located.

Figure 10:
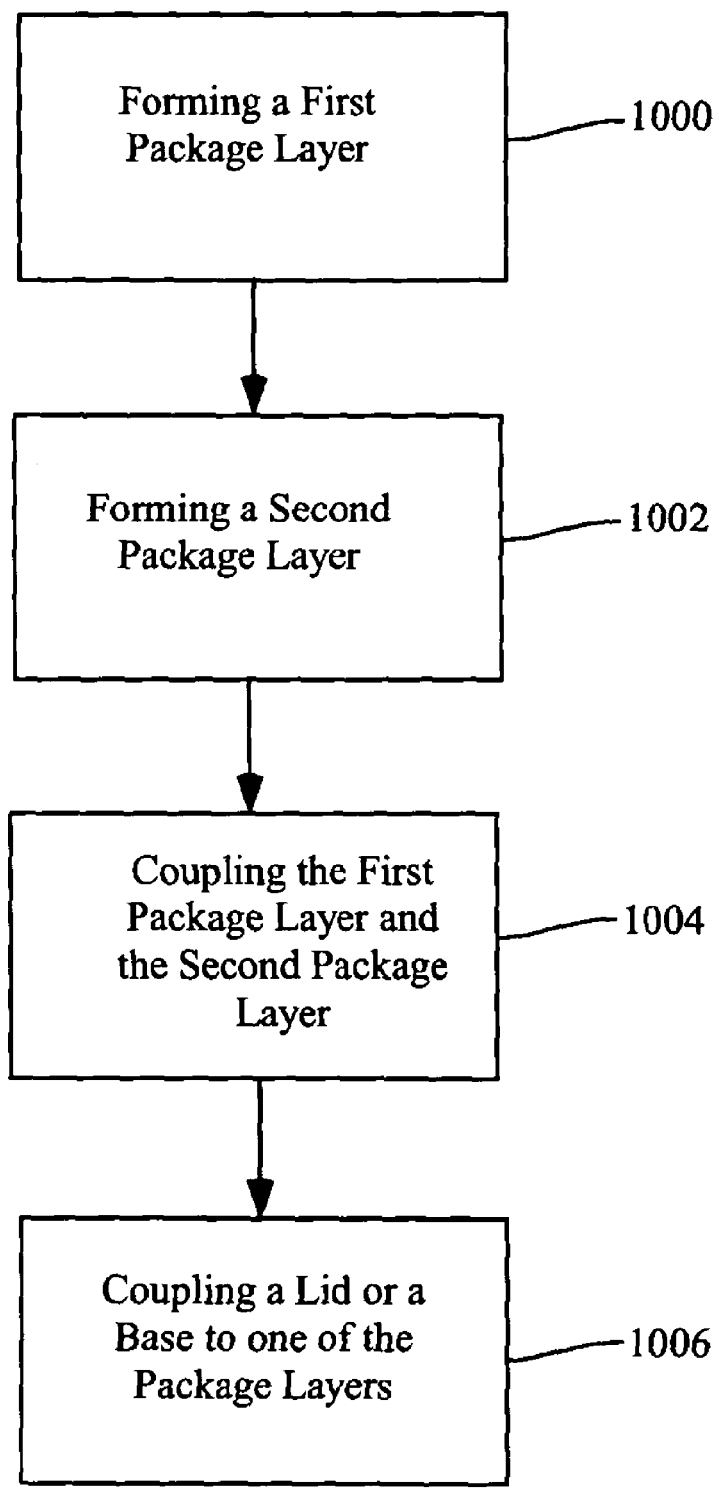
FIG. 10 is a flow chart showing a method of making a highly reliable layered electronic circuit device in accordance with the present invention.

Referring next to FIG. 10, a method is shown for making a highly reliable layered electronic circuit device in accordance with the present invention. The method described can be used for making the embodiments shown and described with reference to FIGS. 1-9.

First, a first package layer is formed 1000. Next, a second package layer is formed 1002. The first package layer and the second package layer are described herein with reference to FIGS. 1-9. In general the first package layer and the second package layer include a circuit package, a radiation shielding base or a radiation shielding lid coupled to the circuit package, and a circuit die. In some embodiments, the first package layer and the second package layer can include a plurality of circuit die coupled to a substrate. Additionally, the first package layer and the second package layer can include a plurality of conductors coupled to the circuit die.

Next, the first package layer is coupled to the second package layer 1004. In some embodiments the base of the first package layer acts as a lid for the second package layer. It should be understood, in accordance with the method described that more package layers could be coupled together to accommodate a larger number of circuit die. For example, if the first package layer and the second package layer include a circuit package, a radiation shielding base and a circuit die, then a similar third package layer could be coupled to the second layer. The base of the second package layer could then act as a lid for the third package layer. If a more layers are desired, they can be added on in a similar fashion. Similarly, for example, if the first package layer and the second package layer include a circuit package, a radiation shielding lid and a circuit die, then a similar third package layer could be coupled to the first package layer. If more layers are desired, they can be added on top of the third package layer.

The next step involves coupled a lid or a base to either the first package layer or the second package layer respectively 1006. If the first package layer and the second package layer are formed with a radiation shielding base, then a lid will be coupled to the first package layer. Alternatively, if the first package layer and the second package layer are formed with a radiation shielding lid, then a base will be coupled to the second package layer.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

The invention claimed is:

1. A radiation shielding integrated circuit device comprising:
a first package layer comprising:
a first circuit package;
a first radiation shielding lid coupled to the first circuit package; and
a first circuit die coupled to the first circuit package; and
a second package layer comprising:
a second circuit package;
a second radiation shielding lid coupled to the second circuit package; and
a second circuit die coupled to the second circuit package; and
a radiation shielding base coupled to a bottom of the second package layer; and
wherein a bottom of the first circuit package is coupled to a top of the second circuit package;
wherein the first package layer is stacked on top of the second package layer.

2. The radiation shielding integrated circuit device of claim 1 further comprising:
a first substrate coupled to the first circuit package; and
a second substrate coupled to the second circuit package;
at least one circuit die coupled to the first substrate; and
at least one circuit die coupled to the second substrate.

3. The radiation shielding integrated circuit device of claim 2 further comprising solder connecting the first substrate to the first circuit package.

4. The radiation shielding integrated circuit device of claim 3 wherein the solder connecting the first substrate to the first circuit package comprises solder balls.

5. The radiation shielding integrated circuit device of claim 1 wherein the first package layer and the second package layer are attached with solder.

6. The radiation shielding integrated circuit device of claim 5 wherein the solder attaching the first package layer and the second package layer comprises solder balls.

7. The radiation shielding integrated circuit device of claim 1 wherein the first radiation shielding lid comprises a high Z material.

8. The radiation shielding integrated circuit device of claim 1 wherein the radiation shielding base comprises a high Z material.

9. The radiation shielding integrated circuit device of claim 1 wherein the radiation shielding base acts as a heat sink.

10. The radiation shielding integrated circuit device of claim 1 wherein the first and second package layers are hermetically sealed.

11. The radiation shielding integrated circuit device of claim 1 wherein the first radiation shielding lid comprises a high Z material and a low Z material.

12. The radiation shielding integrated circuit device of claim 1 wherein the radiation shielding base comprises a high Z material and a low Z material.

13. A high density circuit package comprising:
a first package layer comprising:
a first circuit package;
a first thermally conductive base coupled to the first circuit package; and
a first circuit die coupled to the first thermally conductive base;
wherein the first circuit die is coupled to the first thermally conductive base through a thermal via; and
a second package layer comprising:
a second circuit package;
a second thermally conductive base coupled to the second circuit package; and
a second circuit die coupled to the second thermally conductive base;
wherein the second circuit die is coupled to the second thermally conductive base through a thermal via; and
wherein the first thermally conductive base of the first package layer acts as a lid of the second package layer.

14. The high density circuit package of claim 13 further comprising a first thermal layer connector and a second thermal layer connector coupled to the first thermally conductive base and the second thermally conductive base.

15. The high density circuit package of claim 14 wherein the first circuit die comprises memory.

16. The high density circuit package of claim 13 wherein the first thermally conductive base comprises a radiation shielding material.

17. The high density circuit package of claim 16 wherein the first circuit die and second circuit die are shielded from receiving an amount of radiation greater than the total dose tolerance of the circuit die.

18. The high density circuit package of claim 13 further comprising a thermally conductive lid coupled to the top of the first package layers.

19. The high density circuit package of claim 13 wherein the first circuit package comprises a ceramic.

20. A radiation shielding integrated circuit device comprising:
a first package layer comprising:
a first circuit package;
a first radiation shielding base;
a first circuit die;
a first substrate coupled to the first radiation shielding base;
a first thermal via fed through the first substrate and coupling the first circuit die to the first radiation shielding base; and
a first radiation shielding lid coupled to the first circuit package; and
a second package layer comprising:
a second circuit package;
a second radiation shielding base;
a second circuit die;
a second substrate coupled to the second radiation shielding base;
a second thermal via fed through the second substrate and coupling the second circuit die to the second radiation shielding base; and
wherein the base of the first package layer acts as a lid of the second package layer.

21. A radiation shielding integrated circuit device comprising:
a plurality of package layers comprising:
a circuit package;
a radiation shielding base coupled to the circuit package; and
a circuit die coupled to the radiation shielding base; and
a radiation shielding lid coupled to the plurality of package layers; and
a substrate coupled to the radiation shielding base; and
a plurality of circuit die coupled to the substrate;

a thermal connection between the plurality of package layers coupling a first of the plurality of radiation shielding bases to a second of the plurality of radiation bases;

wherein the circuit die are shielded from receiving an amount of radiation greater than the total dose tolerance of the circuit die;

wherein the plurality of package layers are stacked on top of each other such that a bottom of a first package layer acts as a top of a second package layer.

22. A method of shielding an integrated circuit device comprising:
forming a first package layer comprising a first radiation shielding lid, a first circuit package and a first circuit die;
forming a second package layer comprising a second radiation shielding lid, a second circuit package and a second circuit die;
coupling a top of the first package layer to a bottom of the second package layer; and
coupling a base to the first package layer;
wherein the first package layer is stacked on top of the second circuit package layer.

23. The method of shielding the integrated circuit device of claim 22 further comprising forming the base from a high Z material.

24. The method of shielding the integrated circuit device of claim 22 further comprising forming the first radiation shielding lid from a high Z material.

25. The method of shielding the integrated circuit device of claim 22 further comprising forming the second radiation shielding lid from a high Z material.

26. The method of shielding the integrated circuit device of claim 22 further comprising forming the base from a high Z material and a low Z material.

27. The method of shielding the integrated circuit device of claim 22 further comprising forming the first radiation shielding lid from a high Z material and a low Z material.

28. The method of shielding the integrated circuit device of claim 22 further comprising forming the second radiation shielding lid from a high Z material and a low Z material.

29. The method of shielding the integrated circuit device of claim 22 wherein the first circuit die receives an amount of radiation less than the total dose tolerance of the first circuit die.

30. The method of shielding the integrated circuit device of claim 22 wherein the second circuit die receives an amount of radiation less than the total dose tolerance of the second circuit die.

31. A method of making a highly reliable package that protects a plurality of integrated circuit die within different layers of the package from radiation comprising the steps of:
providing a first layer of the package;
placing a first circuit die within the first layer of the package;
providing a lid for the first layer of the package sufficient to shield the first circuit die from receiving through the lid an amount of radiation greater than the total dose tolerance of the first circuit die;
providing a second inner layer of the package;
placing a second circuit die within the second inner layer of the package;
wherein the second inner layer and the lid of the first layer are sufficient to shield the second circuit die from receiving through the lid of the first layer and through the second inner layer an amount of radiation greater than the total dose tolerance of the second circuit die.

32. The method of claim 31 wherein the first circuit die has a total dose tolerance greater than the total dose tolerance of the second circuit die.

33. The method of claim 31 further comprising placing a base on the package.

34. A method of making a high density circuit package comprising:
forming a first package layer comprising:
a first circuit package;
a first thermally conductive base coupled to the circuit package; and
a first circuit die coupled to the thermally conductive base;
coupling the first circuit die to the first thermally conductive base through a first thermal via; and
forming a second package layer comprising:
a second circuit package;
a second thermally conductive base coupled to the circuit package; and
a second circuit die coupled to the thermally conductive base; and
coupling the second circuit die to the second thermally conductive base through a second thermal via;
wherein the first thermally conductive base of the first package layer serves as a lid of the second package layer.

35. The method of claim 34 further comprising coupling a thermally conductive lid to the first package layer.

36. The method of claim 34 wherein the first circuit die is a memory.

37. The method of claim 34 further comprising forming the first thermally conductive base from copper-tungsten.

38. A method of making a high density circuit package comprising:
coupling a first thermally conductive base to a first package layer;
coupling a first circuit die to the first thermally conductive base;
coupling a second package layer to the first package layer; and
coupling a second circuit die to the first thermally conductive base; and
coupling a thermally conductive layer between the first package layer and the second package layer.

39. The method of claim 38 further comprising coupling the thermally conductive layer to the first thermally conductive base with a thermal via.

40. The method of claim 38 further comprising coupling a thermally conductive lid to the second package layer.

41. The method of claim 40 further comprising coupling the thermally conductive lid to the thermally conductive layer with a thermal via.

42. The radiation shielding integrated circuit device of claim 1 wherein each circuit die is shielded from receiving an amount of radiation greater than the total dose tolerance of the circuit die.

43. The radiation shielding integrated circuit device of claim 20 wherein each circuit die is shielded from receiving an amount of radiation greater than the total dose tolerance of the circuit die.

44. The radiation shielding integrated circuit device of claim 21 wherein each circuit die are shielded from receiving an amount of radiation greater than the total dose tolerance of the circuit die.

45. A radiation shielding integrated circuit device comprising:
a first package layer comprising:
a first circuit package;

a first radiation shielding base coupled to the first circuit package; and
a first circuit die coupled to the first radiation shielding base; and
a first radiation shielding lid coupled to the first package layer; and
a first substrate coupled to the first radiation shielding base; and
the first circuit die coupled to the first substrate;
a second circuit package layer comprising;
a second radiation shielding base coupled to the second circuit package; and
a second circuit die coupled to the second radiation shielding base; and
a second substrate coupled to the second radiation shielding base; and
the second circuit die coupled to the second substrate;
a thermal connection between the first and second package layers coupling the first radiation shielding base to the second radiation shielding base;
wherein the radiation shielding base of the first package layer acts as a top of the second package layer.

* * * * *